United States Patent [19]

Lewis

[11] Patent Number: 4,856,035
[45] Date of Patent: Aug. 8, 1989

[54] CMOS BINARY UP/DOWN COUNTER

[75] Inventor: Edward T. Lewis, Sudbury, Mass.

[73] Assignee: Raytheon Company, Lexington, Mass.

[21] Appl. No.: 199,831

[22] Filed: May 26, 1988

[51] Int. Cl.⁴ .................... H03K 23/44; H03K 23/52; H03K 23/56
[52] U.S. Cl. .................................. 377/116; 377/117; 377/123; 377/121
[58] Field of Search ............... 377/116, 117, 123, 125, 377/45

[56] References Cited

U.S. PATENT DOCUMENTS

| | | | |
|---|---|---|---|
| 3,422,254 | 1/1969 | Lundin | 377/116 |
| 3,798,554 | 3/1974 | Sadlak | 377/116 |
| 3,870,962 | 3/1975 | D'Errico | 328/58 |
| 3,943,378 | 3/1976 | Beutler | 377/117 |
| 4,037,085 | 7/1977 | Minorikawa | 377/116 |
| 4,214,173 | 7/1980 | Popper | 377/117 |
| 4,297,591 | 10/1981 | Roesler et al. | 377/117 |
| 4,611,337 | 9/1986 | Evans | 377/123 |
| 4,741,006 | 4/1988 | Yamaguchi et al. | 377/116 |
| 4,759,043 | 7/1988 | Lewis | 377/117 |

Primary Examiner—John S. Heyman
Attorney, Agent, or Firm—Walter F. Dawson; Richard M. Sharkansky

[57] ABSTRACT

A high speed CMOS binary up/down counter having a 200 MHZ clock rate comprises a 4-bit counting section that may be concatenated in multiple 4-bit sections. The counter performs in an up-count mode or a down-count mode in accordance with the state of a mode select signal. Each stage of the 4-bit counting section comprises a propagate/kill/generate gate for determining the status of a carry signal to a next stage, except the last stage of a 4-bit section, which does not require such a gate because it is coupled to a carry-forward generator along with the outputs from the other preceeding stages in the section. Each 4-bit section performs the counting function through a successive process of modulo-two sums of a lower order carry and the current state of a counter stage without the need for cumbersome gating structures.

24 Claims, 4 Drawing Sheets

CMOS BINARY UP/DOWN COUNTER

BACKGROUND OF THE INVENTION

This invention relates to binary counters and more particularly to a high speed binary up/down (U/D) counter implemented with CMOS technology having a plurality of multi-bit stages which may be concatenated in multiple sections.

Binary ripple time counters are well known in the prior art. They have been implemented utilizing CMOS technologies but have the disadvantage of the carry rippling through each stage of the binary counter which takes a considerable amount of time. In order to decrease this carry ripple time, look-ahead circuits comprising AND or NAND gates have been used; however, such gates have required a significant amount of die area as the number of counter stages increases thereby increasing the number of inputs to look-ahead gates. In addition, the time delays associated with the increased gating reduces the counting rate of such a binary counter.

A CMOS transmission gate look-ahead carry circuit has been utilized in a CMOS synchronous binary counter as described in U.S. Pat. No. 3,943,378, inventor R. R. Beutler which requires only a small amount of die area. However, this is a counter with ripple carry employing a carry pass structure which looks at the previous stage employing toggle flip-flops to effect a count; a compromise is made between obtaining a higher speed binary counter and minimizing usage of the die area.

In U.S. Pat. No. 4,037,085 to inventor Kazuo Minorikawa a binary counter is shown which may have its count advanced at a high speed in accordance with a control signal. Each stage senses its own current state in determining what happens in the next stage; however, in a continuous counting operation considerable time is required in this invention for the carry signal to ripple from one stage to the next stage.

A CMOS binary up/down counter is described in U.S. Pat. No. 4,611,337 to Michael W. Evans. A counter stage comprises an exclusive-OR gate, a D-type flip-flop and a multiplexer interconnected to operate in accordance with a clock signal and a U/D control signal. The fabrication of a multiplexer in CMOS technology is simpler than such implementation in bipolar transistor-transistor-logic (TTL) technology. However, when cascading a plurality of these CMOS up/down counter stages to form an N stage counter with reasonable counting speed, each stage requires a multi-input AND gate having the number of inputs equal to its stage position in the counter, with the last stage having an N input AND gate; this results in the inefficient use of die area of a CMOS integrated circuit.

An improvement in the art of high speed CMOS binary counters is described in U.S. Pat. No. 4,759,043 entitled CMOS Binary Counter filed by Edward T. Lewis and assigned to the present assignee. In such CMOS binary counter each 4-bit counter section performs a counting function through a successive process of additions of a lowest order stage carry input, and each bit stage within a 4-bit section uses the current state of each stage to determine what happens in the next stage. A carry-forward generator instead of a carry-generation network provides a carry-forward signal to the next 4-bit counter section with a worse case delay of only a 2-input gate delay thereby enabling high speed operation.

SUMMARY OF THE INVENTION

In accordance with the present invention a high speed CMOS binary up/down counter is provided without the need for cumbersome carry signal gating structures comprising a 4-bit up/down counting section that may be concatenated in multiple 4-bit sections. Each bit stage of a 4-bit section comprises means for storing a bit of a binary count, the storing means having a data input, a clock input, a first output providing the bit of the binary count and a second output providing a complement signal of the first output, means having an output coupled to the input of the storing means for performing a modulo-two sum of a lower order carry signal and the first output or the second output of the storing means in accordance with an up/down mode selection signal, and means coupled to the up/down mode selection signal and the lower order carry signal for determining whether to propagate/kill or propagate/generate a higher order carry signal in accordance with the state of the up/down mode selection signal and the first output or second output of the storing means in accordance with the state of the up/down mode selection signal.

The up/down counter comprises a selector means coupled to the first output and the second output of the storing means for selecting whether the first output or the second output of the storing means is coupled to the modulo-two summing means and the higher order carry determining means in accordance with the state of the up/down mode selection signal. Since there is no lower order carry signal for a first stage of the counter, an equivalent signal is generated by a count selector means in accordance with the state of the up/down mode selection signal. The counter operates as an up-counter when the up/down mode selection signal is a logic one and the counter operates as a down-counter when the mode selection signal is a logic zero. Each section of the up/down binary counter comprises carry-forward generation means coupled to the outputs of each stage of a section, an output from a previous adjacent carry-forward generating means and a first bit output of a first one of the sections of the counter for generating a carry-forward signal. Each storing means in each counter stage comprises a reset input for resetting the counter to zero.

In accordance with a further feature of the invention, a method of performing binary up/down counting with a plurality of sequentially coupled stages is provided comprising the steps of storing a bit of a binary count in a storing means having a data input, a clock input, a first output providing the bit of the binary count and a second output providing a complement signal of the said first output, performing a modulo-two sum of a lower order carry signal and the first output or the second output of the storing means in accordance with an up/down mode selection signal, the result of the modulo-two sum being coupled to said input of said storing means, and determining whether to propagate/kill or propagate/generate a higher order carry signal in accordance with the state of the up/down mode selection signal and the first output or the second output of the storing means in accordance with the state of the up/down mode selection signal. The method comprises the step of generating the lower order carry signal for a first stage of the counter by a count selector means in accordance with the state of the up/down mode selection signal. The method comprises the step of operating as an up-counter when the up/down mode selection signal is a logic one and of operating as a down-counter when the up/down mode selection signal is a logic zero. The method further comprises the step of resetting said binary count in said storing means to zero.

BRIEF DESCRIPTION OF THE DRAWINGS

Other and further features of the invention will become apparent in connection with the accompanying drawings wherein.

DESCRIPTION OF THE PREFERRED EMBODIMENTS

Figure 1:
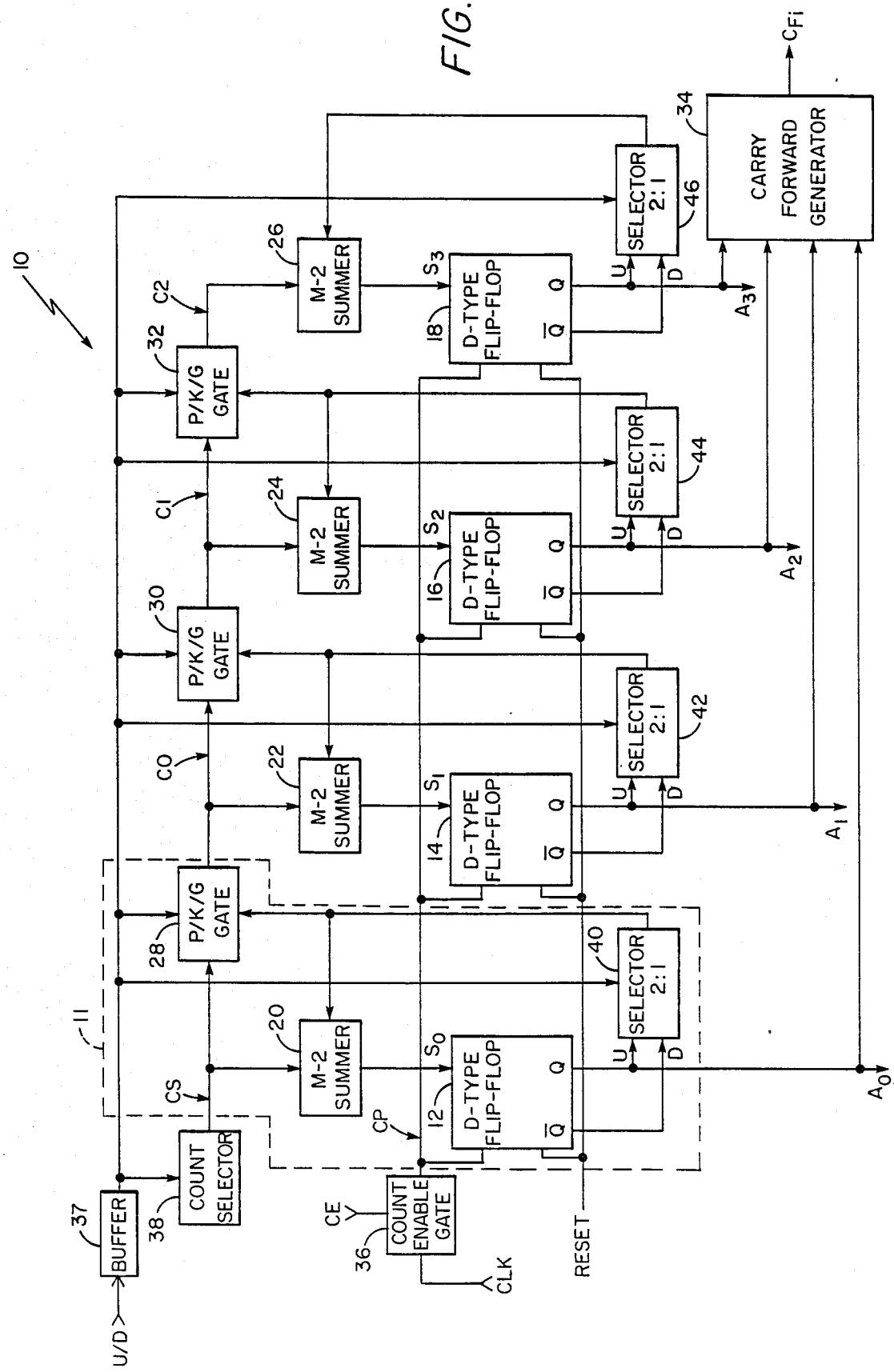
FIG. 1 is a functional block diagram of the invention showing a high speed 4-bit binary up/down counter.

Referring now to FIG. 1 there is shown a functional block diagram of a 4-bit section 10 of a complementary metal oxide semiconductor (CMOS) high speed binary up/down counter having four sequentially coupled stages capable of operating at greater than a 200 MHZ clock rate. The 4-bit section 10 performs either an increment (up-count) or a decrement (down-count) in accordance with an up/down count mode select signal.

Figure 4:
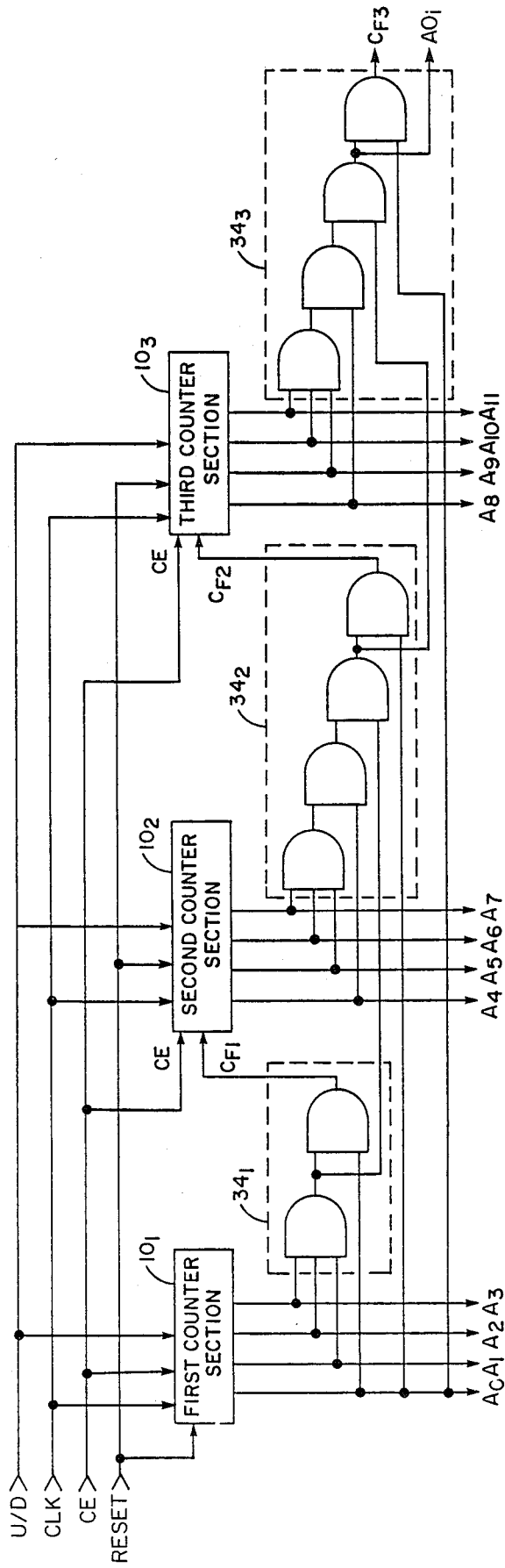
FIG. 4 is a functional block diagram of three concatenated 4-bit binary up/down counter sections showing the carry forward logic networks coupling one section to the next section.

Still referring to FIG. 1, each stage 11 of the four stages within section 10 comprises a D-type flip-flop 12, 14, 16, 18 for count storage and a modulo-two (M-2) summer 20, 22, 24, 26 for performing two's complement addition, each output of said modulo-two summer $S_0$, $S_1$, $S_2$, $S_3$ being coupled to an input of each D-type flip-flop 12, 14, 16, 18 respectively. Also, there is a propagate/kill/generate (P/K/G) gate 20, 22, 24, 26 in the first three stages of the 4-bit section 10. The P/K/G gate 20-26 function is to propagate a carry, kill a carry or generate a carry. However, the fourth stage of section 10 does not have a P/K/G gate because of a carry-forward generator 34 logic network having inputs coupled to the outputs of each of the 4 stages in counter section 10. The carry-forward generator 34 provides a carry-forward signal ($CF_i$) to another 4-bit counter section when counter sections are concatenated as shown in FIG. 4. Each P/K/G gate 28-32 has an input coupled to an output of a 2:1 selector 40, 42, 44, 46 respectively. The Q and $\overline{Q}$ outputs of each D-type flip-flop 12-18 are coupled to the inputs of the 2:1 selector 40-44 respectively. In addition, each P/K/G gate 28-32 has an input coupled to an output of a previous P/K/G gate except the first stage 11 of the counter section 10 that receives a signal from a count selector 38 which is a logic one for an up-count and a logic zero for a down-count. The count selector 38 output signal is also coupled to an input of M-2 summer 20. The input to the count selector 38 is an up/down mode control select signal (U/D) which is also coupled to the 2:1 selector 40-46 and the P/K/G gate 28-32 of each counter stage. There are two input signals, count enable (CE) and clock (CLK), that control the counting operation of the counter section 10. The up/down counting sequence is determined by the U/D level signal input. When U/D signal is in the logic one state, an up-count is selected, and when the U/D signal is in the logic zero state, a down-count is selected. The actual counting process commences when the count enable (CE) signal is raised to the logic one state while the input clock (CLK) signal is in the logic zero state. When CLK is raised to the logic one state, the first count (up or down) is registered at the counter output's $A_0$, $A_1$, $A_2$, $A_3$ of each counter stage of the binary counter section 10. The D-type flip-flop 12, 14, 16, 18 in each counter stage may be of a presettable design known to one of ordinary skill in the art so that the counting process can begin from any binary number. When the clock enable (CE) signal becomes a logic zero, the counting process stops with the current state of each stage remaining at the counter stages outputs ($A_0$, $A_1$, $A_2$, $A_3$).

Referring now to FIG. 1 and Table 1, the status of signals in counter section 10 is shown when performing an up-count from decimal 0 to 10. First the U/D signal is set to a logic one level to perform an up-count which puts the count selector 38 in the logic one state. The count selector 38 is only present in the lowest order bit position and is used to establish the initial carry input state. The 2:1 selector 40 is set by the U/D signal to sample the Q-state of the D-type flip-flop 12. The P/K/G gate 28 is also set by the U/D signal to sample the present state of the Q output and perform only a P/K function of the P/K/G/ gate 28 to either propagate a carry or to kill a carry because the G path is disabled as a result of being in the up-count mode. Assume that the up-count is starting from an all zero count wherein all the D-flip-flops 40-46 are reset to a logic zero. Before the count enable (CE) is raised to the logic one state, the output of each counter stage $A_1$, $A_2$, . . . $A_i$ is sampled. The modulo-two summer 20 performs the exclusive-OR function between the count selector 38 output (CS) and the $A_0$ output of the first counter stage (e.g., $S_0 = CS \oplus A_0$). Since $A_0$ equals zero and CS equals one, $S_0$ equals one. The P/K/G gate samples the state of $A_0$ and performs a kill (K) operation (generate a logic 0 at P/K/G gate output, $C_0$), if $A_0$ is in the logic zero state, or it performs a propagate (P) operation if $A_0$ is in the logic one state. However, in this case $A_0$ equals zero and the P/K/G gate 28 is placed in the K state and essentially becomes the "CS like" signal to the next stage. The M-2 summer 22 in the next stage performs the function $S_1 = P/K)_0 \oplus A_1$. Under these conditions $S_1$ equals zero, because $P/K)_0$ equals zero and $A_1$ equals zero. Thus, when CE equals one and CLK equals one, the $S_0$ equals one and $S_1$ equals zero are transferred to the $A_0$ and $A_1$ counter outputs respectively. As soon as this occurs, the $A_0$ and $A_1$ counter outputs are sampled by M-2 summers 20 and 22 respectively. The $S_0$ output from M-2 summer 20 becomes a logic zero because CS equals one and $A_0$ equals one. Furthermore, since $A_0$ equals one, the P/K/G gate 28 is placed in the propagate (P) state which allows CS equals 1 to be passed to the next stage. The modulo-two summer 22 then samples the stage and performs the function $S_1 = P/K)_0 \oplus A_1$, and since $P/K)_0$ equals one and $A_1$ equals zero, $S_1$ equals one. When the next clock signal occurs, the states of $S_0$ and $S_1$ are transferred to the $A_0$ and $A_1$ counter outputs respectively. In this case $A_0$ goes to zero and $A_1$ goes to one, and the binary number $(0010)_2$ is stored in counter section 10. Additional clock signals result in the signal states shown in Table 1 when ten clock pulses have occurred.

TABLE 1

UP-COUNT OPERATION

| U/D | CS | CLOCK COUNT (DECIMAL) | $A_0$ | $A_1$ | $A_2$ | $A_3$ | C0 $(P/K)_0$ | C1 $(P/K)_1$ | C2 $(P/K)_2$ | $S_0$ | $S_1$ | $S_2$ | $S_3$ |
|---|---|---|---|---|---|---|---|---|---|---|---|---|---|
| 1 | 1 | 0  | 0 | 0 | 0 | 0 | 0 | 0 | 0 | 1 | 0 | 0 | 0 |
| 1 | 1 | 1  | 1 | 0 | 0 | 0 | 1 | 0 | 0 | 0 | 1 | 0 | 0 |
| 1 | 1 | 2  | 0 | 1 | 0 | 0 | 0 | 0 | 0 | 1 | 1 | 0 | 0 |
| 1 | 1 | 3  | 1 | 1 | 0 | 0 | 1 | 1 | 0 | 0 | 0 | 1 | 0 |
| 1 | 1 | 4  | 0 | 0 | 1 | 0 | 0 | 0 | 0 | 1 | 0 | 1 | 0 |
| 1 | 1 | 5  | 1 | 0 | 1 | 0 | 1 | 0 | 0 | 0 | 1 | 1 | 0 |
| 1 | 1 | 6  | 0 | 1 | 1 | 0 | 0 | 0 | 0 | 1 | 1 | 1 | 0 |
| 1 | 1 | 7  | 1 | 1 | 1 | 0 | 1 | 1 | 1 | 0 | 0 | 0 | 1 |
| 1 | 1 | 8  | 0 | 0 | 0 | 1 | 0 | 0 | 0 | 1 | 0 | 0 | 1 |
| 1 | 1 | 9  | 1 | 0 | 0 | 1 | 1 | 0 | 0 | 0 | 1 | 0 | 1 |
| 1 | 1 | 10 | 0 | 1 | 0 | 1 | 0 | 0 | 0 | 1 | 1 | 0 | 1 |

MODULO-2 SUMMER STATE EQUATIONS:
$S_0 = CS \oplus A_0$
$S_1 = (P/K)_0 \oplus A_1$
$S_2 = (P/K)_1 \oplus A_2$
$S_3 = (P/K)_2 \oplus A_3$
$(P/K)_i$: PASS WHEN $A_i$ HIGH
$(P/K)_i$: KILL WHEN $A_i$ LOW Table 2 shows the status of signals in counter section 10 when down-counting, arbitrarily starting at the 4-bit binary number $(0110)_2$. The down-count mode is established by setting the U/D signal level to a logic zero state which causes the 2:1 selectors 40-46 to select the $\overline{Q}$ outputs of the D-type flip-flops in the counter section 10, sets the count select 38 output signal to a logic zero state, and selects the P/G function of the P/K/G gates 28-32. The decrementing operation is performed through the process of two's complement addition similar to that for up-counting. The logic operations are summarized in Table 2. The down-counting and up-counting modes of operation are enabled by only the U/D signal. This signal may be changed when the clock (CLK) is in the logic zero state. When the signal CE is in the logic zero state, the counter outputs ($A_0, A_1, \ldots A_i$) retain the last count.

Figure 2:
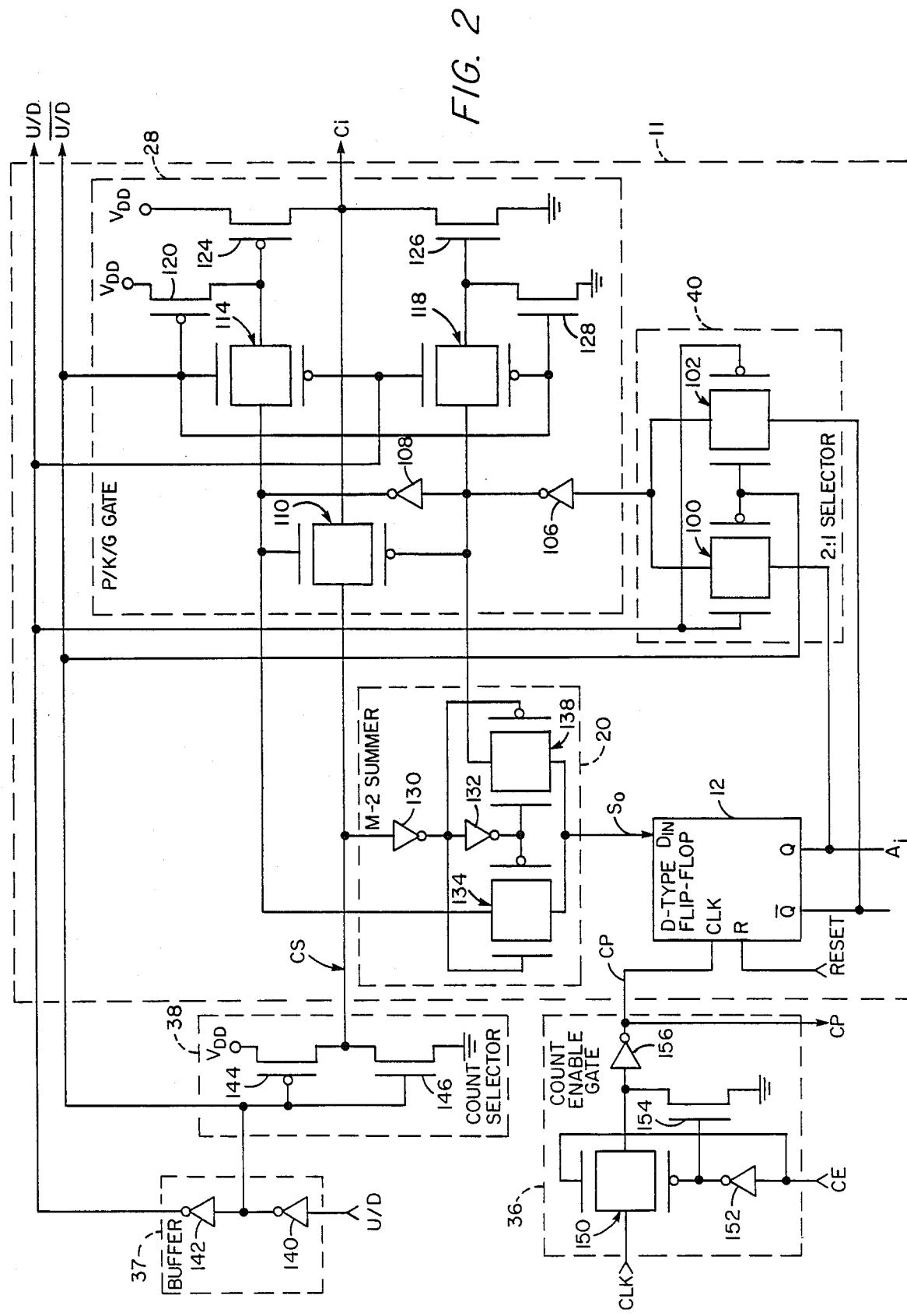
FIG. 2 is a diagram showing an embodiment of one stage of the 4-bit binary up/down counter.

Referring now to FIG. 2, a more detailed diagram of the first stage 11 of the 4-bit binary up/down counter section 10 is shown along with the circuits for the count enable gate 36, buffer 37 and count selector 38. The storage element of each counter stage 11 is implemented with a D-type flip-flop 12 having its CLK input connected to the count pulse (CP) output signal of the count enable gate 36. The $D_{in}$ input of the D-type flip-flop 12 is connected to the $S_0$ output of the modulo-two summer 20. The reset signal to the R input of the D-type flip-flop is a general reset line for resetting the counter 10 to zero.

Q and $\overline{Q}$ output signals of D-type flip-flop 12 are connected to transmission gates (T-gates) 100 and 102 respectively of a 2:1 selector 40. When the counter section 10 is in the up-count mode (U/D set to a logic one), the 2:1 selector 40 selects the Q output, and when counter section 10 is in the down-count mode (U/D set to a logic zero), the 2:1 selector 40 selects the $\overline{Q}$ output. The output of the 2:1 selector 40 is coupled to a P/K/G gate 28. This output goes through inverters 106 and 108 to obtain the required logic levels. The output from inverter 106 is coupled also to M-2 summer 20. The P/K/G gate 28 comprises a propagate T-gate 110, a generate T-gate 114 and a kill T-gate 118. The U/D signal determines which portions of the P/K/G gate functions during an up-count mode and during a down-count mode. For example, in the up-count mode (U/D equals logic one an $\overline{U/D}$ equals logic zero) the 2:1 selector samples the Q output of D-type flip-flop 12 and the P/K/G gate 28 is set up in a P/K mode to either propagate a carry, Ci, or kill such a carry. Hence, in the up-count mode either T-gate 110 passes the carry signal, Ci, in accordance with its input from the count selector 38 or a previous P/K/G gate (for other stages), or T-gate 118 kills or prevents passage of a carry signal, Ci, by causing transistor 126 to be in a conducting or ON state. In the down-count mode (U/D equals logic zero and $\overline{U/D}$ equals logic one) the 2:1 selector samples the Q output of D-type flip-flop 12 and the P/K/G gate 28 is set up in a P/G mode to either propagate a carry, Ci, or generate such a carry. Hence, in the down-count

TABLE 2

DOWN-COUNT OPERATION

| U/D | CS | CLOCK COUNT (DECIMAL) | $A_0$ | $A_1$ | $A_2$ | $A_3$ | C0 $(P/G)_0$ | C1 $(P/G)_1$ | C2 $(P/G)_2$ | $S_0$ | $S_1$ | $S_2$ | $S_3$ |
|---|---|---|---|---|---|---|---|---|---|---|---|---|---|
| 0 | 0 | 0 | 0 | 1 | 1 | 0 | 0 | 1 | 1 | 1 | 0 | 1 | 0 |
| 0 | 0 | 1 | 1 | 0 | 1 | 0 | 1 | 1 | 1 | 0 | 0 | 1 | 0 |
| 0 | 0 | 2 | 0 | 0 | 1 | 0 | 0 | 0 | 1 | 1 | 1 | 0 | 0 |
| 0 | 0 | 3 | 1 | 1 | 0 | 0 | 1 | 1 | 1 | 0 | 1 | 0 | 0 |
| 0 | 0 | 4 | 0 | 1 | 0 | 0 | 0 | 1 | 1 | 1 | 0 | 0 | 0 |
| 0 | 0 | 5 | 1 | 0 | 0 | 0 | 1 | 1 | 1 | 0 | 0 | 0 | 0 |
| 0 | 0 | 6 | 0 | 0 | 0 | 0 | 0 | 0 | 0 | 1 | 1 | 1 | 1 |
| 0 | 0 | 7 | 1 | 1 | 1 | 1 | 1 | 1 | 1 | 0 | 1 | 1 | 1 |

MODULO-2 SUMMER STATE EQUATIONS:
$S_0 = \overline{A}_0 \oplus CS$
$S_1 = \overline{A}_1 \oplus (P/G)_0$
$S_2 + \overline{A}_2 \oplus (P/G)_1$
$S_3 + \overline{A}_3 \oplus (P/G)_2$
$(P/G)_i$: PASS WHEN $A_i$ LOW
$(P/G)_i$: GENERATE WHEN $A_i$ HIGH mode either T-gate 110 passes a carry in accordance with its input from the count selector 38 or a previous P/K/G gate (for other stages), or T-gate 114 generates a carry by causing transistor 124 to be in a conducting or ON state. The M-2 Summer 20 comprises T-gates 134 and 138 arranged to perform an exclusive-OR logic function. Inverters 130 and 132 generate the appropriate polarity signals for performing the exclusive-OR function on two signal inputs, a first input signal being a CS signal from the count selector 38 when the M-2 summer 20 is in the first stage of the counter section 10 (or in subsequent stages the first input signal being a Ci signal from a previous P/K/G gate output) and a second input signal being the output from the 2:1 selector 40. The M-2 summer essentially generates partial sums during the operation of the counter section 10 and the partial sum output 50 is coupled to the $D_{in}$ input of D-type flip-flop 12.

Still referring to FIG. 2, there are three auxiliary circuits required in each counter section 10. The count enable gate 36 comprises an AND T-gate for generating a count pulse (CP) when the CLK and CE signals are both asserted so the counting occurs synchronous with the clock. The inverter 152 provides the appropriate CP logic level. The buffer 37 comprises two inverters 140 and 142 for providing the required signal gain and both the U/D logic one signal and the U/D logic zero signal for use within a counter section 10. The count selector 38 comprises transistors 144 and 146 which act as switches for generating the CS signal as a logic one or a logic zero depending on whether the counter is in the up-count mode or the down-count mode respectively.

Figure 3:
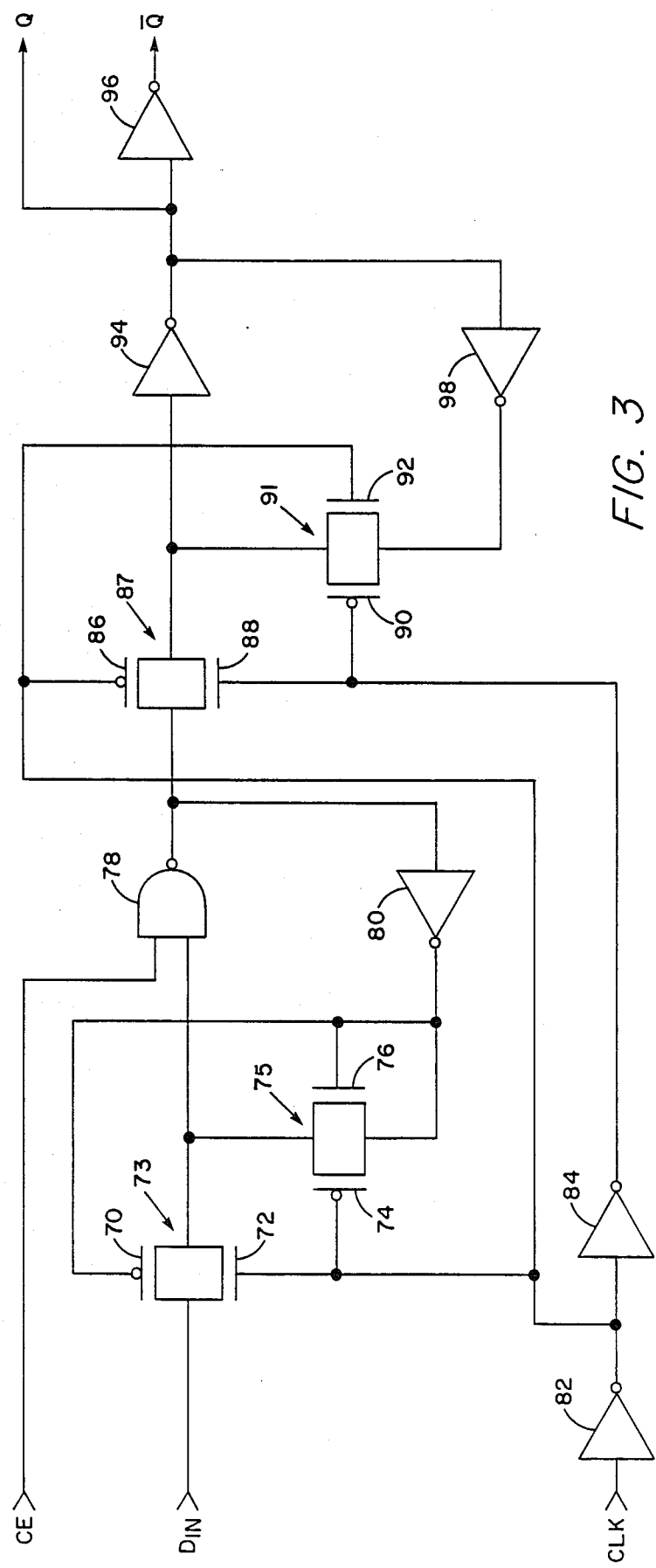
FIG. 3 is a diagram of a delay flip-flop in each stage of the binary up/down counter for storing an accumulated counter output.

Referring now to FIG. 3, a diagram of the CMOS D-type flip-flop 12–18 is shown comprising CMOS transmission gates 73, 75, 87, and 91 for implementation in a binary counter section 10. Such a logic circuit is known to one skilled in the art. AND gate 78 provides for a synchronous reset capability. An inverter 82 functions as a clock buffer/driver for use by the CLK signal within each flip-flop 12–18 of a counter section 10. Inverter 94 and 96 are enhanced to provide an intermediate drive capability for the Q and $\overline{Q}$ output signals of the D-type flip-flop. The use of a D-type flip-flop instead of, for example, a toggle flip-flop, provides for data to already be stored and ready for a clock signal thereby eliminating any delay time consideration of the flip-flop itself from reducing the counter speed.

Referring now to FIG. 4, three binary counter sections $10_1$, $10_2$, $10_3$ are shown in a concatenated embodiment resulting in a 12 stage binary up/down counter with outputs $A_0$–$A_{11}$. The U/D mode control signal is provided for selecting whether the binary counter functions as an up-counter or a down-counter. The CLK signal is provided to each counter section $10_1$, $10_2$, $10_3$ along with the CE signal to each counter section. Within each section the actual process of counting commences when the count enable (CE) signal is raised to a logic one state while the input clock (CLK) signal is in the logic zero state. When CLK is raised to the logic one state, the first count (up or down depending on the state of the U/D signal) is registered at the counter output's $A_1, A_2 \ldots A_i$ where i equals eleven in the three section concatenated counter embodiment shown in FIG. 4. Between each counter section is a carry-forward generator $34_1$, $34_2$, $34_3$ network each one of which only produces one gate delay during the counting sequence because of the inherent design of this high speed binary up/down counter.

This concludes the description of the preferred embodiment. However, many modifications and alterations will be obvious to one of ordinary skill in the art without departing from the spirit and scope of the inventive concept. Therefore, it is intended that the scope of this invention be limited only by the appended claims.

What is claimed is:

1. A binary up/down counter having a plurality of sequentially coupled stages, each of said stages comprising:

means for storing a bit of a binary count, said storing means having a data input, a clock input, a first output providing said bit of the binary count and a second output providing a complement signal of said first output;

means having an output coupled to said data input of said storing means for performing a modulo-two sum of a lower order carry signal and said first output or said second output of said storing means in accordance with an up/down mode selection signal;

means coupled to said up/down mode selection signal and said lower order carry signal for determining whether to propagate/kill or propagate/generate a higher order carry signal in accordance with the state of said up/down mode selection signal and said first output or said second output of said storing means in accordance with the state of said up/down mode selection signal; and means coupled to said first output and said second output of said storing means for selecting whether said first output or said second output of said storing means is coupled to said modulo-two summing means and said higher order carry determining means in accordance with the state of said up/down mode selection signal.

2. The binary up/down counter as recited in claim 1 wherein:
   said lower order carry signal for a first stage of said counter is generated by a count selector means in accordance with the state of said up/down mode selection signal.

3. The binary up/down counter as recited in claim 1 wherein:
   said counter operates as an up-counter when said up/down mode selection signal is a logic one; and
   said counter operates as a down-counter when said up/down mode selection signal is a logic zero.

4. The binary up/down counter as recited in claim 1 wherein: said storing means comprises a D-type flip-flop.

5. The binary up/down counter as recited in claim 1 wherein:
   said storing means, modulo-two summing means and higher order carry determining means are integrated in a CMOS integrated circuit.

6. The binary up/down counter as recited in claim 1 wherein:
   said binary counter comprises means coupled to the output of each of said sequentially coupled stages for generating a carry-forward signal.

7. The binary up/down counter as recited in claim 6 wherein:
   said carry-forward signal generator means provides no more than a two-input gate propagation delay.

8. The binary up/down counter as recited in claim 1 wherein:

said storing means further comprises a reset input for resetting said binary count to zero.

9. The binary up/down counter as recited in claim 1 wherein:
said counter comprises means for gating a clock signal to said storing means.

10. A binary up/down counter having a plurality of concatenated sections comprising:
a plurality of binary up/down counter stages in each of said sections for performing an up/down counting function in accordance with an up/down mode selection signal;
means coupled between each pair of said counter sections for generating a carry-forward signal to an adjacent succeeding one of said sections;
each of said binary counter stages comprising:
(a) means for storing a bit of a binary count, said storing means having a data input, a clock input, a first output providing said bit of the binary count and a second output providing a complement signal of said first output;
(b) means having an output coupled to said data input of said storing means for performing a modulo-two sum of a lower order carry signal and said first output or said second output of said storing means in accordance with said up/down mode selection signal;
(c) means coupled to said up/down mode selection signal and said lower order carry signal for determining whether to propagate/kill or propagate/generate a higher order carry signal in accordance with the state of said mode up/down selection signal and said first output or said second output of said storing means in accordance with the state of said up/down mode selection signal; and
(d) means coupled to said first output and said second output of said storing means for selecting whether said first output or said second output of said storing means is coupled to said modulo-two summing means and said higher order carry determining means in accordance with the state of said up/- mode selection signal.

11. The binary up/down counter as recited in claim 10 wherein:
said lower order carry signal for a first stage of each of said counter sections is generated by a count selector means in accordance with the state of said up/down mode selection signal.

12. The binary up/down counter as recited in claim 10 wherein:
said counter operates as an up counter when said up/down mode selection signal is a logic one; and
said counter operates as a down counter when said up/down mode selection signal is a logic zero.

13. The binary up/down counter as recited in claim 10 wherein:
said storing means comprises a D-type flip-flop.

14. The binary up/down counter as recited in claim 10 wherein:
each of said carry-forward generating means is coupled to the outputs of a plurality of said sequentially coupled stages in a preceding one of said sections, an output from a previous adjacent carry-forward generating means and a first bit output of a first one of said section for generating a carry-forward signal.

15. The binary up/down counter as recited in claim 10 wherein:
each of said carry-forward signal generating means provides no more than a two-input gate propagation delay.

16. The binary up/down counter as recited in claim 10 wherein:
said storing means further comprises a reset input for resetting said binary count to zero.

17. The binary up/down counter as recited in claim 10 wherein:
said counter comprises means for gating a clock signal to said storing means.

18. The binary up/down counter as recited in claim 10 wherein:
said propagate/kill or propagate/generate determining means comprises a P/K/G gating means in each of said stages except in a last stage of each of said counter sections.

19. The binary up/down counter as recited in claim 10 wherein:
said concatenated sections including said carry-forward generator means are integrated in a CMOS integrated circuit.

20. A method of performing binary up/down counting with a plurality of sequentially coupled stages comprising the steps of:
storing a bit of binary count in a storing means having a data input, a clock input, a first output providing said bit of the binary count and a second output providing a complement signal of said first output;
performing a modulo-two sum of a lower order carry signal and said first output or said second output of said storing means in accordance with an up/down mode selection signal, the result of said modulo-two sum being coupled to said input of said storing means;
determining whether to propagate/kill or propagate/generate a higher order carry signal in accordance with the state of said up/down mode selection signal and said first output or said second output of said storing means in accordance with the state of said up/down mode selection signal; and
selecting whether said first output or said second output of said storing means is coupled to a means for performing said modulo-two sum and said higher order carry determining means in accordance with the state of said up/down mode selection signal.

21. The method as recited in claim 20 further comprises the step of:
generating said lower order carry signal for a first stage of said counter by a count selector means in accordance with the state of said up/down mode selection signal.

22. The method as recited in claim 20 further comprises the step of:
operating as an up-counter when said up/down mode selection signal is a logic one; and
operating as a down-counter when said up/down mode selection signal is a logic zero.

23. The method recited in claim 20 further comprises the step of:
resetting said binary count in said storing means to zero.

24. The method as recited in claim 20 further comprises the step of gating a clock signal to said storing means for performing a counting operation.

* * * * *